United States Patent
Ohshima

(10) Patent No.: US 8,089,742 B2
(45) Date of Patent: Jan. 3, 2012

(54) OVERCURRENT PROTECTION APPARATUS FOR LOAD CIRCUIT

(75) Inventor: Shunzou Ohshima, Kosai (JP)

(73) Assignee: Yazaki Corporation, Tokyo (JP)

( * ) Notice: Subject to any disclaimer, the term of this patent is extended or adjusted under 35 U.S.C. 154(b) by 234 days.

(21) Appl. No.: 12/595,332

(22) PCT Filed: Apr. 10, 2008

(86) PCT No.: PCT/JP2008/057107
§ 371 (c)(1),
(2), (4) Date: Oct. 9, 2009

(87) PCT Pub. No.: WO2008/126907
PCT Pub. Date: Oct. 23, 2008

(65) Prior Publication Data
US 2010/0118461 A1     May 13, 2010

(30) Foreign Application Priority Data

Apr. 10, 2007   (JP) ................................ 2007-102734

(51) Int. Cl.
*H02H 5/04* (2006.01)
(52) U.S. Cl. ........................ 361/93.8; 361/103
(58) Field of Classification Search ................. 361/93.1, 361/93.2, 93.8, 103
See application file for complete search history.

(56) References Cited

U.S. PATENT DOCUMENTS

| | | | |
|---|---|---|---|
| 5,501,517 A * | 3/1996 | Kiuchi | 361/101 |
| 7,149,098 B1 * | 12/2006 | Chen | 363/56.09 |
| 2005/0275990 A1 | 12/2005 | Ohshima | |
| 2008/0232017 A1 * | 9/2008 | Nakajima | 361/93.7 |

FOREIGN PATENT DOCUMENTS

| | | |
|---|---|---|
| JP | 02-087817 A | 3/1990 |
| JP | 02-249976 A | 10/1990 |
| JP | 2000-231417 A | 8/2000 |
| JP | 2004-48498 A | 2/2004 |

OTHER PUBLICATIONS

International Search Report for PCT/JP2008/057107 dated Jun. 17, 2008 [PCT/ISA/210].

* cited by examiner

*Primary Examiner* — Rexford Barnie
*Assistant Examiner* — Christopher Clark
(74) *Attorney, Agent, or Firm* — Sughrue Mion, PLLC

(57) ABSTRACT

To provide an overcurrent protection apparatus which can surely protect a load circuit from an overcurrent with a simple configuration. Supposing that the temperature increasing amount of a semiconductor element caused when the semiconductor element is turned on is $\Delta Tch$, the on-resistance value of the semiconductor element (T1) is Ron, the thermal resistance value of the semiconductor element (T1) is $Rth\_f$, the temperature increasing amount of a connecting wiring is $\Delta Tw$ when a current flows into the connecting wiring (WL), the resistance value per unit length of the connecting wiring is Rw, and the thermal resistance value per unit length of the connecting wiring is $Rth\_w$, $\Delta Tch$ is obtained based on an expression of $\Delta TW/\Delta Tch = Rth\_w/Rth\_f * Rw/Ron$ with respect to the temperature increasing amount $\Delta Tw$ not exceeding a difference between the upper limit of the permissible temperature of the connecting wiring (WL) and the upper limit of an operational peripheral temperature, then a voltage Vds is obtained based on an expression of $\Delta Tch = Rth\_f * Vds^2/Ron$ with respect to the $\Delta Tch$ thus obtained, and the voltage Vds thus obtained is set as a determination voltage.

2 Claims, 3 Drawing Sheets

OVERCURRENT PROTECTION APPARATUS FOR LOAD CIRCUIT

TECHNICAL FIELD

The present invention relates to an overcurrent protection apparatus for a load circuit which surely interrupts the load circuit to protect the load circuit when an overcurrent flows into the load circuit having a power supply, an electronic switch and a load.

BACKGROUND TECHNIQUE

FIG. 3 is a circuit diagram showing the configuration of an overcurrent protection apparatus of a related art. The overcurrent protection apparatus shown in the figure is provided in a load circuit which includes a power supply VB, a load RL and a semiconductor switch T11 formed by an FET. The overcurrent protection apparatus interrupts the semiconductor switch T11 to protect the load circuit when an overcurrent flows into the load circuit. This operation will be explained concretely.

The overcurrent protection apparatus includes a MOSFET (T12) constituting a multi-source FET with respect to the semiconductor switch T11. The drain of the MOSFET (T12) is connected to the power supply VB, and a connecting point Y1 of the MOSFET (T12) and the power supply VB is connected to the drain of the semiconductor switch T11. The source of the MOSFET (T12) is grounded via a resistor Rr. The gate of the MOSFET (T12) is connected to the gate of the semiconductor switch T11 at a connecting point Y2. The connecting point Y2 is connected to the output terminal of a driver 112 via a resistor R1.

A latch DF1 formed by an AND circuit AND1, a switch SW1, a resistor R2 and a D flip-flop is provided on the input side of the driver 112. The switch SW1 and the resistor R2 are coupled in series, and the serially coupled circuit is provided between the power supply VB and the ground. The connecting point of the switch SW1 and the resistor R2 is connected to one of the input terminals of the AND circuit AND1. The one of the input terminals of the AND circuit AND1 is also connected to the reset terminal of the latch DF1. Further, the other of the input terminals of the AND circuit AND1 is connected to the output terminal (Q_bar) of the latch DF1.

The source of the semiconductor switch T11 is connected to the negative side input terminal of a comparator CMP1, the positive side input terminal of the comparator CMP1 is connected to the source of the MOSFET (T12), and the output terminal of the comparator CMP1 is connected to the input terminal of the latch DF1.

Hereinafter, the operation of the load circuit including the overcurrent protection apparatus shown in FIG. 3 will be explained. When the switch SW1 is turned on, since the output of the latch DF1 is at a high (H) level at this time, the output of the AND circuit AND1 becomes an H level, whereby the driver 112 supplies a charge pump voltage to the gate of the multi-source FET (common gate of T11 and T12).

Thus, the semiconductor switch T11 is turned on and so a load current ID flows therethrough. Further, since the MOSFET (T12) is also turned on, a reference signal Iref flows through the MOSFET (T12). The MOSFET (T12) constituting the multi-source FET has the same characteristics as the semiconductor switch T11 and the channel width thereof is normally set in a range between (1/2000) and (1/1000) of the channel width of T11. Supposing that (channel width of T11)/(channel width of T12) is n, n is in a range between 1,000 and 2,000.

Supposing that the source voltages of the semiconductor switch T11 and the MOSFET (T12) are VSA and VSB respectively, ID becomes n*Iref when VSA is equal to VSB. The value of the voltage VSA depends on the resistance value of the load RL, and the value of the voltage VSB depends on the value of the resistor Rr. The value of the resistor Rr is set in a manner that the voltage VSA is larger than the voltage VSB in the normal state of the load RL and the wiring of the load circuit. Thus, in the normal state, since the voltage supplied to the negative side input terminal of the comparator CMP1 is larger than the voltage supplied to the positive side input terminal thereof, the output of the comparator CMP1 is held at a low (L) level.

When a wiring between the semiconductor switch T11 and the load RL is short-circuited to the ground in a state where the load current ID flows, the load current ID is increased and the voltage VSA becomes smaller than the voltage VSB, whereby the output of the comparator CMP1 changes into the H level and so the output of the latch DF1 becomes the L level. Thus, since the output of the AND circuit AND1 becomes the L level, the output terminal of the driver 112 is grounded, so that the gate of the multi-source FET (common gate of T11 and T12) is grounded through the resistor R1 and hence each of the semiconductor switch T11 and the MOSFET (T12) is turned off. As a result, since a short-circuit current is interrupted, the wiring and the semiconductor switch T11 can be protected from the overcurrent.

In the case where multi-source FET (T11, T12) is normal, the wiring of the load circuit and the semiconductor switch T11 can be protected by the overcurrent detection function. However, when the on-resistance value of the semiconductor switch T11 increases abnormally, the wiring and the semiconductor switch T11 can not be protected by the overcurrent detection function as to such the abnormality The following case is supposed as a cause of abnormally increasing of the on-resistance value. That is, each of the semiconductor switch T11 and the MOSFET (T12) is configured by many small FETs (hereinafter called element FETs) coupled in parallel. When the insulation film of the gate of a part of the element FETs is broken and the connection between the gate and the body thereof is short-circuited, a small leak current flows between the gate and the body, that is, between the gate and the source. The leak current flows through the resistor R1 coupled in series with the gate to thereby cause a voltage drop across the resistor R1. When the breakage of the element FET advances and the leak current increases, the voltage drop across the resistor R1 increases to thereby reduce the voltage between the gate and the source of each of the semiconductor switch T11 and the MOSFET (T12). Since the gate of the semiconductor switch T11 and the gate of the MOSFET (T12) are connected to each other, each of the on-resistance values of the semiconductor switch T11 and the MOSFET (T12) increases in the similar manner and a shunt-current ratio therebetween does not change.

Supposing that the resistance value of the load RL is 20, when the output voltage of the power supply VB is 12 volt, the load current ID becomes 6 ampere, and the on-resistance value of the FET usually used with respect to the load RL is about 10 mΩ. If the on-resistance value increases to 100 mΩ from 10 mΩ due to the leak current between the gate and the body, the load current ID becomes 12 V/(2Ω+0.1Ω)=5.71 ampere. Since the load current ID is 12 V/(2Ω+0.01Ω)=5.97 ampere in the normal state, the load current ID reduces by 0.26 ampere.

The comparator CMP1 detects the increase of the current but can not detect the reduction of the current. Even if a comparing unit (comparator) is added in order to detect the reduction of the current, since the voltage change between the source voltages VSA and VSB due to the reduction of 0.26 ampere is a small value of about 26 mV, it is difficult to accurately detect the current reduction to turn off the FET while avoiding the erroneous determination. On the other hand, since an amount of heat generated from each of the semiconductor switch T11 and the MOSFET (T12) becomes about ten times as large as that in the normal state, each of the semiconductor switch T11 and the MOSFET (T12) is broken when such the state is left as it is for a long time. An overheat interrupting function is incorporated into the semiconductor switch T11 in order to prevent such the breakage. That is, the overheat interrupting function is an indispensable constituent element in a current sensor using the multi-source FET.

Summarizing the aforesaid contents, when the semiconductor switch is disposed on the high-side of the load, that is, between the power supply and the load, the following methods have been employed as methods of protecting the semiconductor switch and the connecting wiring between the semiconductor switch and the load.

(1) The detecting unit for detecting the current flowing through the semiconductor switch is provided to turn off the element when the overcurrent exceeding the normal current range flows. As the method of detecting the overcurrent, there are the method of adding the shunt resistor in series with the element to directly detect the current flowing through the element and the method of determining the overcurrent by using the current which is obtained by dividing the current flowing through the element at the constant shunt-current ratio. The latter method is realized by using the multi-source FET etc.

(2) In the case where a large overcurrent flows due to the dead short-circuit etc., the element may be broken by the heat loss before the overcurrent is detected and the element is turned off. Further, when the on-resistance value of the element increases by any reason, the temperature of the element may exceed the allowable temperature (absolute rated value) due to self-heating even by a current lower than the overcurrent determination value. As a countermeasure against these problems, there is provided with the overcurrent interrupting function for interrupting the current flowing through the element when the temperature of the element exceeds the predetermined temperatures.

The semiconductor switch is advantageous in the miniaturization and the small amount of heat generation due to no-utilization of a fuse. However, in the conventional technique, as described above, the semiconductor switch requires the two kinds of detecting processes for detecting the current and the temperature in the overcurrent protection, which causes the increase of the cost of the semiconductor switching element. Thus, since the cost of the semiconductor switching element is higher to a large extent as compared with the cost of the simple configuration of the fuse and the relay, the spread of the semiconductor switching element is impeded.

JP-A-2004-48498 (patent literature 1) discloses the technique relating to the aforesaid overcurrent protection apparatus. The patent document 1 discloses a technique in which a critical voltage is obtained from a product of the on-resistance value of a semiconductor switch and the minimum current value when the channel temperature of the semiconductor switch reaches the upper limit of a permissible temperature, and the semiconductor switch is turned off at a time point before the voltage reaches the critical voltage to thereby protect the semiconductor switch.
Patent Literature 1: JP-A-2004-48498

DISCLOSURE OF THE INVENTION

Problems that the Invention is to Solve

However, the overcurrent protection apparatus described in the patent literature 1 can protect the semiconductor element surely. However, a wiring coupling between the semiconductor element and a load is not fully considered as an object to be protected.

The invention is made in order to solve the aforesaid problem of the related art and an object of the invention is to provide an overcurrent protection apparatus for a load circuit which can surely protect a semiconductor element and a wiring coupling between the semiconductor element and a load at a time of the generation of an overcurrent.

Means for Solving the Problems

In order to attain the aforesaid object, there is provided an overcurrent protection apparatus according to the invention comprising:

a semiconductor element (T1) which is provided between a load (RL) and a power supply (VB);

a load circuit which controls turning-on and turning-off of the semiconductor element to control driving and stop of the load;

a comparing unit (CMP1) which compares a voltage (Vds) generated across both terminals of the semiconductor element when the semiconductor element is in a turned-on state with a determining voltage (VB−V1) set in advance; and a semiconductor element control unit which turns the semiconductor element off to protect the load circuit when the comparing unit determines that the voltage (Vds) is larger than the determining voltage, wherein a temperature increasing amount of the semiconductor element caused when the semiconductor element (T1) is turned on is $\Delta Tch$, an on-resistance value of the semiconductor element (T1) is Ron, and a thermal resistance value of the semiconductor element (T1) is $Rth\_f$;

wherein a temperature increasing amount of a connecting wiring is $\Delta Tw$ when a current flows into the connecting wiring (WL) for connecting between the load and the semiconductor element, a resistance value per unit length of the connecting wiring is Rw, and a thermal resistance value per unit length of the connecting wiring is $Rth\_w$; and wherein $\Delta Tch$ is obtained based on an expression of $\Delta Tw/\Delta Tch=Rth\_w/Rth\_f*Rw/Ron$ with respect to the temperature increasing amount $\Delta Tw$ not exceeding a difference between an upper limit of a permissible temperature of the connecting wiring (WL) and an upper limit of an operational peripheral temperature, then the voltage Vds is obtained based on an expression of $\Delta Tch=Rth\_f*Vds^2/Ron$ with respect to the $\Delta Tch$, and the obtained voltage Vds is set as the determination voltage.

Further, there is provided an overcurrent protection apparatus according to the invention comprising:

a semiconductor element (T1) which is provided between a load (RL) and a power supply (VB);

a load circuit which controls turning-on and turning-off of the semiconductor element to control driving and stop of the load;

a comparing unit (CMP1) which compares a voltage (Vds) generated across both terminals of the semiconductor element when the semiconductor element is in a turned-on state with a determining voltage (VB−V1) set in advance; and a semiconductor element control unit which turns the semiconductor element off to protect the load circuit when the comparing unit determines that the voltage (Vds) is larger than the determining voltage, wherein a temperature increasing amount of the semiconductor element caused when the semiconductor element (T1) is turned on is $\Delta Tch$, an on-resistance value of the semiconductor element (T1) is Ron, and a thermal resistance value of the semiconductor element (T1) is Rth_f;

wherein a voltage Vds obtained from an expression of $\Delta Tch=Rth\_f*Vds^2/Ron$ with respect to the temperature increasing amount $\Delta Tch$ of the semiconductor element corresponding to a difference between an upper limit of a permissible temperature of the semiconductor element and an upper limit of an operational peripheral temperature is set as a first voltage Vds1;

wherein a temperature increasing amount of a connecting wiring is $\Delta Tw$ when a current flows into the connecting wiring (WL) for coupling between the load and the semiconductor element, a resistance value per unit length of the connecting wiring is Rw, and a thermal resistance value per unit length of the connecting wiring is Rth_w;

wherein $\Delta Tch$ is obtained based on an expression of $\Delta TW/\Delta Tch=Rth\_w/Rth\_f*Rw/Ron$ with respect to the temperature increasing amount $\Delta Tw$ corresponding to a difference between an upper limit of a permissible temperature of the connecting wiring and an upper limit of an operational peripheral temperature, then the voltage Vds is obtained based on an expression of $\Delta Tch=Rth\_f*Vds^2/Ron$ with respect to the $\Delta Tch$, and the obtained voltage Vds is set as a second voltage Vds2; and wherein a smaller voltage between the first voltage Vds1 and the second voltage Vds2 is set as a voltage Vlim, and a voltage equal to or smaller than the voltage Vlim and larger than the voltage Vds in a case where a normal current flows is set as the determining voltage.

EFFECTS OF THE INVENTION

According to the overcurrent protection apparatus for a load circuit of the invention, even if an overcurrent is generated, since the semiconductor element is turned off before the channel temperature of the semiconductor element or the temperature of the connecting wiring for coupling between the semiconductor element and the load reaches the permissible upper limit temperature, each of the semiconductor element and the connecting wire is prevented from being broken.

Figure 1:
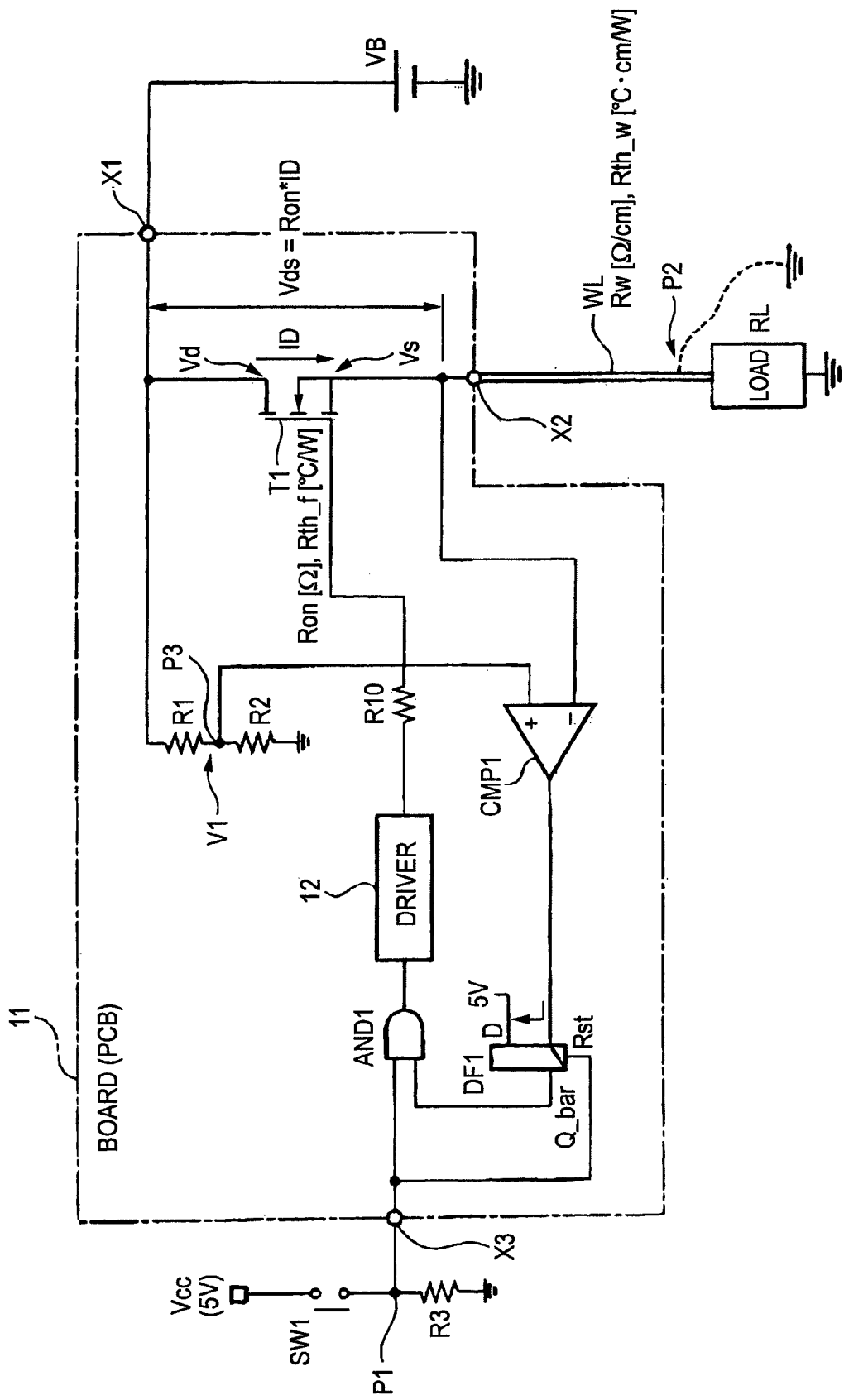
FIG. 1 is a circuit diagram showing the configuration of the overcurrent protection apparatus for a load circuit according to an embodiment of the invention

EXPLANATION OF SIGNS 11 board
12 driver
T1 semiconductor switch (semiconductor element)
WL wiring (connecting wiring)
VB battery
CMP1 comparator
DF1 latch

BEST MODE FOR CARRYING OUT THE INVENTION

Hereinafter, an embodiment of an overcurrent protection apparatus for a load circuit according to the invention will be explained. First, the explanation will be made as to the principle of the overcurrent protection apparatus explained in this embodiment.

The breakage of an FET (semiconductor switch) and a wiring provided in a load circuit due to an overcurrent is caused by that the temperature of each of the FET and the wiring increases due to the Joule heat generated by the overcurrent and exceeds the upper limit of a permissible temperature. In other words, each of the FET and the wiring is not broken even if a large overcurrent flows so long as the temperature does not exceed the permissible temperature.

The overcurrent protection method of the related art utilizing the current detection is formed on condition that the value of the overcurrent relates to the temperature increasing value of the FET and the wiring. Then, under such the precondition, a current value supposed to exceed the upper limit of the permissible temperature is determined, and the semiconductor switch is turned off before a current exceeds the current value to protect the FET and the wiring. Thus, this method of detecting the overcurrent is an indirect method as to a target of not exceeding the upper limit of the permissible temperature.

If fluctuation or variance is contained in the relative relation between the current value and the temperate increase, the temperature estimation result is directly influenced by the fluctuation or variance. In contrast, the overcurrent protection apparatus according to the embodiment employs a method of detecting the temperature increasing amount of the FET and the temperature increasing amount of the wire without using a current value.

The permissible value of the temperature increasing amount of each of the FET and the wire is obtained as a difference between the upper limit of the permissible temperature and the upper limit of an operational peripheral temperature. On the other hand, since the temperature increasing amount of the semiconductor switch has a proportional relation with respect to that of the wiring, the temperature increasing amount of the wire can be estimated from the temperature increasing amount of the semiconductor switch with a remarkably high accuracy.

A drain-source voltage Vds in a case where one of the FET and the wire reaches the upper limit of the permissible temperature increasing amount thereof is obtained and set as a voltage Vlim. The overcurrent protection apparatus according to the embodiment is configured in a manner that a voltage equal to or less than the voltage Vlim is set as a determination voltage, then the determination voltage is compared with the drain-source voltage at a time where the current (overcurrent) flows through the FET, and the FET is kept in a turned-on state when the drain-source voltage does not exceed the determination voltage but is turned off when the drain-source voltage exceeds the determination voltage. Thus, within the entire operational temperature range, each of the FET and the wire can be prevented from exceeding the upper limit of the permissible temperature increasing amount even when any current (a normal current and an overcurrent) flows.

According to the wire protection of the related art, the specification of a wire is set in accordance with the characteristics of a fuse (overcurrent protection function). That is, the wire is protected by matching the wire to the fuse. According to the present invention, the fuse (overcurrent protection function) is matched to the wire by measuring the temperature increasing amount of the wire by using the drain-source voltage of the FET. Thus, the wire protection can be optimized, that is, an amount of copper used for the wiring function can be minimized.

Further, since the aforesaid overcurrent protection method is performed by merely comparing the drain-source voltage of the FET with the determination value, the overcurrent protection function can be realized with a simple configuration and the cost of the apparatus can be reduced.

Hereinafter, the overcurrent protection apparatus for a load circuit according to the embodiment will be explained concretely. FIG. 1 is a circuit diagram showing the configuration of the load circuit including the overcurrent protection apparatus according to the embodiment of the invention. As shown in the figure, the overcurrent protection apparatus according to the embodiment is a circuit for supplying a power output from a battery VB to a load RL to drive the load RL. The overcurrent protection apparatus is mounted on a board (PCB) 11. That is, the positive terminal of the battery VB is connected to the terminal X1 of the board 11 and the one end of the load RL is connected to a terminal X2 via a wiring (connecting wiring) WL. Further, a connecting point P1 between a switch SW1 and a resistor R3 of a series coupling circuit of the switch SW1 and the resistor R3 is connected to a terminal X3. The one end of the switch SW1 is connected to a voltage Vcc (5 volt). Hereinafter, the circuit configuration within the board 11 will be explained.

A semiconductor switch T1 formed by a MOSFET is provided on the board 11. The drain (voltage Vd) of the semiconductor switch T1 is connected to the terminal X1 and also grounded via a series coupling circuit of resistors R1 and R2.

Further, the source (voltage Vs) is connected to the terminal X2 and also connected to the negative side input terminal of a comparator (a comparing unit) CMP1. The positive side input terminal of the comparator CMP1 is connected to a connecting point P3 (voltage V1) between the resistors R1 and R2.

The output terminal of the comparator CMP1 is connected to the input terminal of a latch DF1 formed by a D flip-flop. The output terminal (Q_bar) of the D flip-flop is connected to one input terminal of an AND circuit AND1. The reset input terminal of the D flip-flop is connected to the terminal X3 and the terminal X3 is connected to the other input terminal of the AND circuit AND1.

The output terminal of the AND circuit AND1 is connected to the input terminal of a driver 12 (a semiconductor element control unit) and the output terminal of the driver 12 is connected to the gate of the semiconductor switch T1 via a resistor R10.

The overcurrent protection apparatus according to the embodiment is arranged to turn off the semiconductor switch T1 to protect a load circuit when a load current ID flowing through the load circuit becomes an overcurrent. The load circuit is configured by a series connection of the battery VB, the load RL and the semiconductor switch T1 formed by the power MOSFET.

The functions of the load circuit and the overcurrent protection apparatus configured in the aforesaid manner will be explained. Since the latch DF1 is reset when the switch SW1 is turned off, the output (Q_bar) of the latch DF1 becomes the H level and this H level signal is supplied to the one input terminal of the AND circuit AND1.

Further, since the other input terminal of the AND circuit AND1 is supplied with the voltage at the point P1 via the terminal X3, the output signal of the AND circuit AND1 is changed into the H level when the voltage at the point P1 becomes the H level in response to the turning-on of the switch SW1. The H level output signal is supplied to the driver 12. Thus, the driver 12 outputs a voltage boosted by a charge pump (battery voltage VB+about 10 volt) and supplies the boosted voltage to the gate of the semiconductor switch T1 via the resistor R10. As a result, since the semiconductor switch T1 is turned on, the drain current ID flows into the load RL via the wiring WL. That is, the load RL can be driven.

On the other hand, when the switch SW1 is turned off, the output of the driver 12 is grounded since the output signal of the AND circuit AND1 becomes the L level, whereby the semiconductor switch T1 is turned off to interrupt the current ID. That is, the load RL can be stopped.

Supposing that the drain-source voltage of the semiconductor switch T1 is Vds and an on-resistance value thereof is Ron, the voltage Vds represented by (Vds=Ron*ID) is generated between the drain and the source of the semiconductor switch T1. The source voltage Vs (Vs=VB−Vds) of the semiconductor switch T1 is supplied to the negative side input terminal of the comparator CMP1 and the voltage V1 obtained by dividing the battery voltage VB by the resistors R1 and R2 is supplied to the positive side input terminal of the comparator CMP1. The voltage V1 is set to be Vds<(VB−V1) when the current ID is normal, whereby the output signal of the comparator CMP1 is the L level in the normal state (a state where no overcurrent is generated).

If an abnormality occurs that the wiring WL is grounded at a point P2 in the turning-on state of the semiconductor switch T1, the current ID increases. As a result, the voltage Vds increases so as to be Vds>(VB−V1) to change the output of the comparator CMP1 into the L level from the H level. Thus, since the output (Q_bar) of the latch DF1 changes into the L level from the H level, the output of the AND circuit AND1 becomes the L level to ground the output of the driver 12. Thus, the gate of the semiconductor switch T1 is grounded via the resistor R10 to turn off the semiconductor switch T1. In this manner, if the wire WL is grounded accidentally, the semiconductor switch T1 is turned off to protect the entirety of the load circuit.

The voltage at the point P3, that is, the voltage (VB−V1) supplied to the positive side input terminal of the comparator CMP1 is a determination voltage for determining whether or not the drain-source voltage Vds of the semiconductor switch T1 increases. The feature of the invention resides in the setting method of the determination voltage. Hereinafter, the setting method will be explained in detail. First, the concept of the overcurrent protection according to the invention will be explained.

[Concept of Overcurrent Protection]

(a) The breakage of the FET (semiconductor element) or the wiring due to the overcurrent is caused in a manner that the temperature of the FET or the temperature of the wiring increases due to the overcurrent and exceeds the upper limit of the permissible temperature peculiar thereto. Thus, in order to protect the FET and the wiring, it is necessary to interrupt the overcurrent before the temperature exceeds the upper limit of the permissible temperature.

(b) The peripheral temperature in the circumstance where the FET and the wiring are disposed is normally in a wide range from about −40 centigrade to about 120 centigrade and there is necessarily the upper limit in the operational peripheral temperature. Thus, although it is necessary to determine whether or not the temperature of each of the FET and the wiring exceeds the upper limit of the permissible temperature thereof, the invention does not employ a method of measuring an absolute temperature by using a temperature sensor but employs a method of detecting a temperature increasing amount from the upper limit of the operational peripheral temperature.

(c) When the overcurrent flows, the temperature increase of the FET and the wiring is caused by the Joule heat. The magnitudes of the Joule heat at the FET and the wiring have a proportional relation therebetween since the current flowing through the FET and the wiring is the same. The thermal resistance relating the Joule heat with the temperature increasing amount becomes constants when the mounting states of the FET and the wiring are determined, respectively. Thus, the temperature increasing amount of the FET and the temperature increasing amount of the wiring have the proportional relation therebetween.

(d) The temperature increasing amount of the FET has the one-to-one correspondence relation with the drain-source voltage Vds. In other words, the temperature increasing amount of the FET is a function of the voltage Vds. Thus, the temperature increasing amount of the FET can be obtained based on the magnitude of the voltage Vds. Since the temperature increasing amount of the FET and the temperature increasing amount of the wiring have the proportional relation therebetween, the temperature increasing amount of the wiring can be obtained based on the magnitude of the voltage Vds. Further, since the temperature increasing amount of the wiring does not depend on the length of the wiring, the proportional relation of the temperature increasing amount between the FET and the wiring does not change even if the length of the wiring changes.

(e) The upper limit of the increasing amount of the permissible temperature (the upper limit of the permissible value of the temperature increasing amount due to the Joule heat) of each of the FET and the wiring is obtained as a difference between the upper limit of the permissible temperature represented by the absolute value and the upper limit of the operational peripheral temperature as shown by the following expression (1).

(upper limit of increasing amount of permissible temperature)=(upper limit of permissible temperature)−(upper limit of operational peripheral temperature)  (1)

Further, the voltage Vds in a case where one of the FET and the wire reaches the upper limit of the permissible temperature increasing amount thereof is obtained based on the upper limit of the operational peripheral temperature of the FET and set as the upper limit voltage Vlim. The determination voltage (that is, the voltage V1 at the point P3 shown in FIG. 1) for determining whether or not the semiconductor switch (FET) T1 or the wiring WL exceeds the permissible temperature increasing amount based on the magnitude of the voltage Vds is set so as to be equal to or smaller than the upper limit voltage Vlim and larger than the voltage Vds generated by the normal load current. The FET is turned off when the voltage Vds exceeds the determination voltage to thereby protect the FET and the wiring. In general, the determination voltage capable of being set is not a single voltage but a voltages in a predetermined range.

Then, the aforesaid conditions (c), (d) and (e) will be explained in detail.

[Explanation Concerning that the Temperature Increasing Amounts of the FET and the Wiring Have the Proportional Relation as Shown in (c)]

Supposing that the drain current of the FET (semiconductor switch) is ID ampere and the peripheral temperature is Ta centigrade, the temperature increasing amount of the FET due to the Joule heat is obtained. First, respective signs are defined as follows.

Tch: channel temperature [centigrade] of FET, corresponding to a device temperature $\Delta$Tch: temperature increasing amount [centigrade] of FET, $\Delta$Tch=Tch−Ta Rth_f: thermal resistance [centigrade/W] from channel of FET to the atmosphere Ron: on-resistance value of FET [$\Omega$], Ron=Vds/ID Ron25: on-resistance value of FET at Tch=25° C. [$\Omega$]

q: temperature coefficient (differs depending on FET and in a range of 4,200 to 6,700 ppm) of on-resistance with reference to Ron25

The following expressions (2) and (3) are set based on the aforesaid signs.

$$\Delta Tch = Rth\_f * Ron * ID^2 \quad (2)$$

$$Ron = Ron25\{1 + q(Tch - 25)\} \quad (3)$$

Next, the temperature increasing amount at the time where the current ID flows into the wiring is obtained. Respective signs are defined as follows.

Tw: conductor temperature of wiring [centigrade]

$\Delta$Tw: conductor temperature increasing amount of wiring [centigrade]

Rth_w: thermal resistance value of wiring [centigrade*cm/W]

Rw: conductor resistance value of wiring [$\Omega$/cm]

Rw20: conductor resistance value of wiring [$\Omega$/cm] at 20 centigrade

Each of the thermal resistance value and the conductor resistance value used for calculating the temperature increasing amount is a value per unit length unlike the case of the FET.

The calculation expression for the permissible current of a wire is disclosed in JEC3407-1995, "Permissible Current of 600V Vinyl Insulation Wire" as the standard of Japanese Electro-technical Committee and can be represented by the following general expression (4).

$$ID^2 * Rw = (Tw - Ta)/Rth\_w \quad (4)$$

The conductive resistance value Rw at the Tw [centigrade] is represented by the following expression (5).

$$Rw = Rw20\{1 + 0.00393\ (Tw - 20)\} \quad (5)$$

In the case of representing the permissible current by using the expression (4), the conductor maximum utilizing temperature, that is, the permissible temperature upper limit is used as the Tw (conductor temperature of wiring) of the expressions (4) and (5). The expression (4) is represented by the following expression (6) when rewritten by using an expression $\Delta$Tw=Tw−Ta.

$$\Delta Tw = Rth\_w * Rw * ID^2 \quad (6)$$

Since the temperature increasing amounts of the FET and the wiring due to the Joule heat are represented by the aforesaid expressions (2) and (6), respectively, the following expression (7) is obtained when the both sides of the expression (6) are divided respectively by the both sides of the expression (2) so as to obtain a ratio between the temperature increasing amount $\Delta$Tw of the wiring and the temperature increasing amount $\Delta$Tch of the FET.

$$\Delta Tw/\Delta Tch = (Rth\_w * Rw * ID^2)/(Rth\_f * Ron * ID^2) = Rth\_w * Rw)/(Rth\_f * Ron) \quad (7)$$

As understood from the aforesaid expression (7), the right side is not relevant to the magnitude of the current ID. As an example, the value of the expression (7) will be calculated in a case where the diameter (sectional area) of the wire is 0.85 [mm$^2$] and the on-resistance value of the FET at 25 centigrade is 5 [m$\Omega$]. Supposing that the conductor temperature of the wire is 80 centigrade, the conductor resistance value Rw is 27 [m$\Omega$/m] and the thermal resistance value Rth_w becomes 6.6 [centigrade/W] irrespective to the conductor temperature. Further, supposing that the temperature coefficient is 4,700 ppm, the on-resistance value of the FET at 80 centigrade is represented as Ron=5{1+0.0047(80−25)}=6.29 [m$\Omega$]. Supposing that the thermal resistance value Rth_f of the FET is 10 [centigrade/W], the expression (7) is represented as follows when these values are inserted therein.

$$\Delta Tw/\Delta Tch=(6.6*27)/(10*6.29)=2.83$$

However, when the current ID changes, the value of the expression (7) changes since the values of Tw and Tch change. In order to check how the changes of Tw and Tch around the upper limit of the operational peripheral temperature influence on the value of the expression (7), the aforesaid expressions (3) and (5) are rewritten with reference to the resistance value at the peripheral temperature of 100 centigrade. In this case it is supposed that the on-resistance value is Ron100 [Ω] when Tch is 100 centigrade, and the conductor resistance value of the wiring is Rw 100 [Ω/cm] when Tw is 100 centigrade.

$$Ron=Ron25\{1+q\{Tch-25\}\}=Ron100\{1+q/(1+75q)*(Tch-100)\}$$

Supposing that q is 5,500 ppm which is the intermediate value in the range between 4,200 and 6,700, the following expression (8) is obtained.

$$Ron=Ron100\{1+0.0038938\,(Tch-100)\} \qquad (8)$$

Further, the following expression (9) is obtained from the aforesaid expression (5).

$$Rw=Rw100\{1+0.0029899\,(Tw-100)\} \qquad (9)$$

When the expressions (8) and (9) are inserted into the expression (7), the following expression (10) is obtained.

$$\Delta TW/\Delta Tch=(Rth\_w/Rth\_f)*(Rw100/Ron100)*\{1+0.0029899\,(Tw-100)\}/\{1+0.0038938\,(Tch-100)\} \qquad (10)$$

Supposing that $1 \gg 0.0029899$ (Tw−100) and $1 \gg 0.0038938$ (Tch−100), the following expression (11) is obtained.

$$\Delta TW/\Delta Tch \approx (Rth\_w/Rth\_f)*(Rw100/Ron100)*\{1+0.0029899\,(Tw-100)\}-0.0038938\,(Tch-100)\} \qquad (11)$$

Then, supposing that Tw≈Tch, the following expression (12) is obtained.

$$\Delta TW/\Delta Tch \approx (Rth\_w/Rth\_f)*(Rw100/Ron100)*\{1-0.0009039\,(Tch-100)\} \qquad (12)$$

Supposing that Tch is 150 centigrade, the following expression (13) is obtained.

$$\Delta TW/\Delta Tch \approx (Rth\_w/Rth\_f)*(Rw100/Ron100)*0.95305 \qquad (13)$$

When the temperature increasing amount of Tch changes into 150 centigrade from 100 centigrade, the proportional constant of ΔTW/ΔTch reduces by about 4.7%. That is, the actual temperature increasing amount ΔTW of the wiring reduces by about 4.7% as compared with the temperature increasing amount calculated based on the assumption that the temperature increasing amount ΔTW of the wiring is proportional to the channel temperature increasing amount ΔTch of the FET. This results in that the temperature increasing amount of the wiring estimated based on the proportional relation using the temperature increasing amount of the FET shifts to a higher value than the actual amount. However, this shift is the deviation to the safety side with respect to the object of preventing the thermal breakage of the wiring and the deviation amount is small. Thus, this method of estimating the temperature increasing amount of the wiring by using the proportional relation from the temperature increasing amount of the FET is sufficiently practical so long as the temperature increasing amount is within 50 centigrade.

[Explanation Concerning That the Temperature Increasing Amounts of the FET Can be Detected by Using Vds Shown in (d)]

The aforesaid expressions (2) and (3) will be shown again as follows.

$$\Delta Tch=Tch-Ta=ID^2*Ron*Rth\_f \qquad (2)$$

$$Ron=Ron25\{1+q(Tch-25)\} \qquad (3)$$

When the expression (2) is rewritten by using ID=Vds/Ron, the following expression (14) is obtained.

$$\Delta Tch=Vds^2/Ron*Rth\_f \qquad (14)$$

When the expression (14) is revolved as to Vds, the following expression (15) is obtained.

$$Vds^2=\Delta Tch*Ron/Rth\_f$$

$$Vds=[\Delta Tch*Ron/Rth\_f]^{0.5} \qquad (15)$$

Further, when the expression (3) is inserted into Ron, the following expression (16) is obtained.

$$Vds=[\Delta Tch*Ron25\{1+q(Tch-25)\}/Rth\_f]^{0.5}=\\ [\Delta Tch*Ron25\{1+q(Tch-Ta+Ta-25)\}/Rth\_f]^{0.5}=\\ [\Delta Tch*Ron25\{1+q(\Delta Tch+Ta-25)\}/Rth\_f]^{0.5} \qquad (16)$$

When the specification of the FET is determined, Ron25 and q are determined. Also, when the mounting method of the FET is determined, Rth_f is determined. It will be understood that the voltage Vds has the one-to-one correspondence relation with the amount ΔTch from the expressions (15) and (16) when the peripheral temperature Ta is fixed. That is, the voltage Vds can be used as a channel temperature increasing amount sensor. Since the absolute value Tch of the channel temperature is a sum of the temperature increasing amount ΔTch and the peripheral temperature Ta, the voltage Vds can not be a sensor of the absolute value of the channel temperature.

Figure 2:
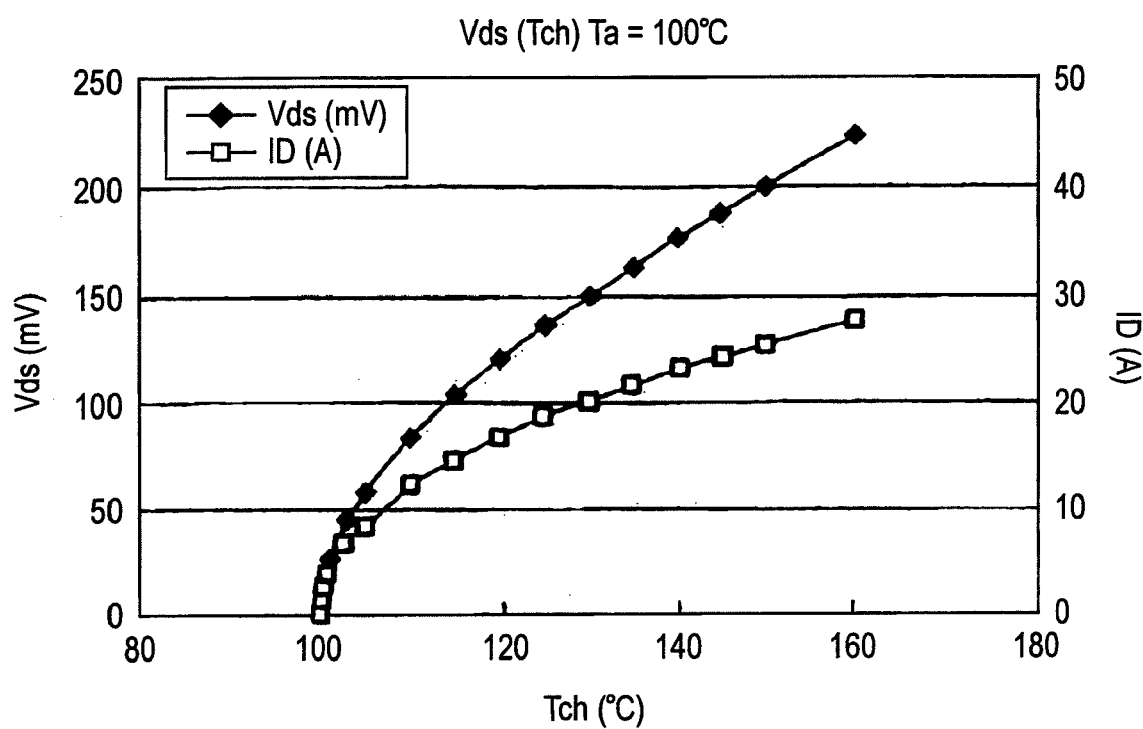
FIG. 2 is a characteristic diagram showing the changes of a voltage Vds and a current ID with respect to the channel temperature of the semiconductor switch.
Figure 3:
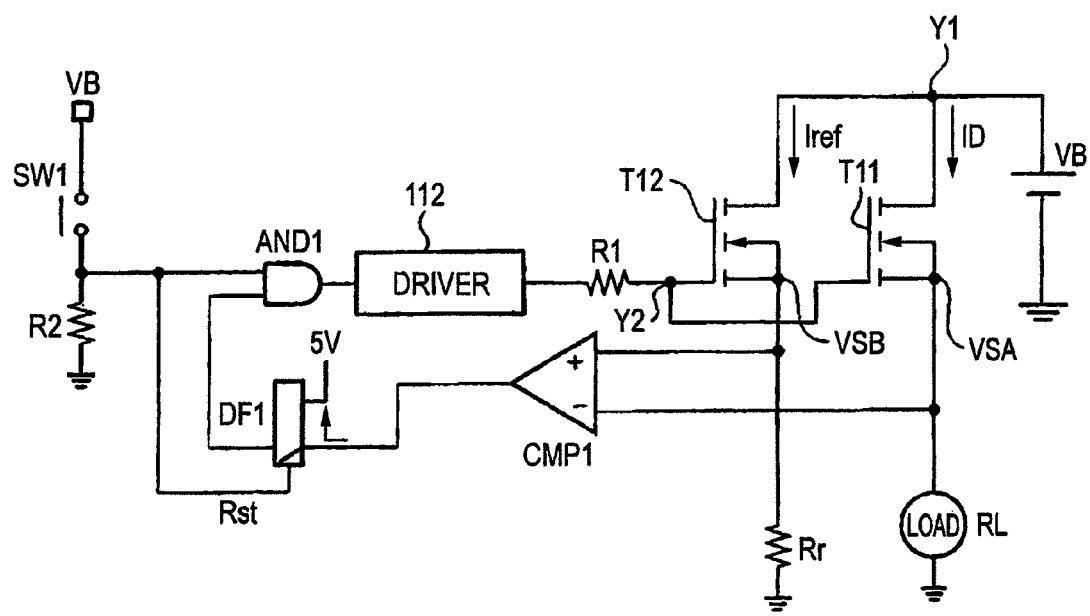
FIG. 3 is a circuit diagram showing the concept of the overcurrent protection apparatus of a related art.

The expression (16) is represented as a graph in order to clarify the relation between Vds and ΔTch. As an example, supposing that Ta is 100 centigrade, Rth_f is 10 centigrade/W, Ron is 5 mΩ and q is 4,700 ppm, the relation between the voltage Vds and the channel temperature Tch is shown in FIG. 2. Also the current ID is shown based on the relation of ID=Vds/Ron.

In FIG. 2, when the current ID is zero, the channel temperature Tch becomes the same temperature as the peripheral temperature 100 centigrade. When the current ID increases, the channel temperature Tch increases, that is, ΔTch increases, whereby the voltage Vds also increases. Supposing that the upper limit of the channel permissible temperature is 150 centigrade, the current ID, the on-resistance value Ron and the voltage Vds at this time will be 25.1 [ampere], 7.35 [mΩ] and 199.2 [mV], respectively.

The following matters will be understood from FIG. 2. That is, when the channel temperature Tch increases, that is, ΔTch increases, the voltage Vds increases monotonously. Since the voltage Vds has the one-to-one correspondence relation with the amount ΔTch (=Tch−Ta), ΔTch is determined when Vds is determined, while Vds is determined when ΔTch is determined. Similarly, the current ID has the one-to-one correspondence relation with the amount ΔTch. Thus, the temperature increasing amount of the FET (semiconductor switch) can be detected not only by measuring the voltage Vds but also by measuring the current ID. Therefore, it will be understood that the corresponding relation of the voltage Vds with respect to ΔTch is equivalent to that of the current ID.

The aforesaid method according to the invention specifies ΔTch by measuring the voltage Vds, whilst the overcurrent protection method of the related art using the current sensor formed by the multi-source FET etc. specifies ΔTch by measuring the current ID. In this respect, it is to be noticed that the method of performing the overcurrent protection by using the voltage Vds as the current sensor has been known as the principle. In order to use the voltage Vds as the current sensor, since the voltage Vds is converted into the current ID or the current is calculated based on the voltage via the on-resistance, the accuracy of the current sensor is degraded due to the temperature drift of the on-resistance. That is, the voltage Vds has been recognized as the current sensor of poor accuracy. Thus, the method of detecting the current based on the drain-source voltage Vds of the semiconductor switch T1, that is, the method of using the voltage Vds as the current sensor for the overcurrent protection has not been employed, but the method of detecting the overcurrent by using the multi-source FET has been employed. However, according to the overcurrent protection method of the FET described above, since the method of detecting the temperature increasing amount of the FET is employed, each of the method of using the voltage Vds and the method of using the multi-source FET can realize the equivalent performance with respect to the object for protecting the circuit by detecting the overcurrent.

It is further to be noticed that with respect to the object of protecting the FET from the overcurrent, the overcurrent protection can be realized by using the voltage Vds as the temperature increasing amount sensor without using any concept of the current detection nor the current sensor. With respect to the wiring WL for coupling the FET and the load, the concept of the voltage corresponding to or equivalent to the voltage Vds (drain-source voltage) of the FET can not be used because it is impossible to specify the position of the wiring WL where the short-circuit or grounding occurs.

[Explanation Concerning the Overcurrent Protection Method Using Vds as the Temperature Increasing Amount Sensor as Shown in (e)]

The contents of the aforesaid explanation will be summarized in the following matters (A) to (C).

(A) The upper limit of the permissible temperature increasing amount ΔTch due to the Joule heat is obtained from the expression (1) based on the upper limit of the operational peripheral temperature and the upper limit of the permissible temperature of the FET, and the voltage Vds is obtained by using the aforesaid expression (16) based on the on-resistance value [Ω] and the thermal resistance value [centigrade/W]. The voltage thus obtained is set as Vds1. Thus, when the FET is turned off before the voltage Vds exceeds the voltage Vds1, the FET does not exceed the upper limit of the permissible temperature and the FET is prevented from being broken.

(B) The upper limit of the permissible temperature increasing amount due to the Joule heat is obtained from the expression (1) based on the upper limit of the operational peripheral temperature and the upper limit of the permissible temperature of the wiring, and the maximum permissible current IDw is obtained by using the aforesaid expressions (4) and (5) based on the conductor resistance value [Ω/cm] and the thermal resistance value [centigrade·cm/W] of the wiring. Further, the on-resistance value Ron is obtained based on the expressions (2) and (3) by using IDw. The on-resistance value Ron is represented by the following expression (17).

$$Ron = Ron25\{1 + q(Ta - 25)\}/(1 - Ron25 * q * IDw^2 * Rth\_f) \quad (17)$$

In the aforesaid expression (17), Ron is obtained by setting Ta to the upper limit of the operational peripheral temperature of the FET and a product of Ron and IDw is obtained as a voltage Vds2. Thus, when the FET is turned off before the voltage Vds exceeds the voltage Vds2, the wiring WL does not exceed the upper limit of the permissible temperature and so is prevented from being broken.

The temperature increasing amount of the wire is represented by the expression (6). In the expression (6), Rth_w represents the thermal resistance value per unit length of the wiring and Rw represents a resistance value per unit length of the wiring. Thus, the temperature increasing amount of the wiring (wire) does not depend on the length of the wire. Therefore, since it is not necessary to change the determination voltage even when the length of the wiring changes, the overcurrent protection method according to the invention can be simplified and the practicability can be enhanced.

(C) The method of setting the determination voltage at the time of performing the overcurrent protection by using the drain-source voltage Vds of the FET as the temperature increasing amount sensor for the FET and the wiring is as follows.

Supposing that the lower voltage between the voltages Vds1 and Vds2 is the upper limit voltage Vlim, the determination voltage is set to be equal to or smaller than the voltage Vlim and larger than the voltage Vds to be generated when the normal drain current ID flows. The values of the resistors R1 and R2 are set in a manner that the voltage (VB−V1) becomes equal to the determination voltage at the maximum operation voltage 16 volt.

In this manner, according to the overcurrent protection apparatus of the invention, since the determination voltage V1 is determined in the aforesaid manner, the load circuit can be surely protected without breaking the semiconductor switch T1 nor the wiring WL even if the overcurrent flows into the load circuit. Further, since the temperature detection sensor is not required, the circuit configuration can be simplified. Further, since an amount of copper to be used can be reduced, the cost and required space can be reduced.

As described above, although the overcurrent protection apparatus according to the invention is explained based on the embodiment shown in the drawings, the invention is not limited thereto and the configurations of the respective parts may be replaced by arbitrary configurations of the similar functions, respectively.

INDUSTRIAL APPLICABILITY

The invention is quite useful since the protection apparatus for a load circuit can be provided which can surely protect the circuit even in a case where an overcurrent flows into the load circuit.

The invention claimed is:

1. An overcurrent protection apparatus, comprising:
a semiconductor element (T1) which is provided between a load (RL) and a power supply (VB);
a load circuit which controls turning-on and turning-off of the semiconductor element to control driving and stop of the load;
a comparing unit (CMP1) which compares a voltage (Vds) generated across both terminals of the semiconductor element when the semiconductor element is in a turned-on state with a determining voltage (VB−V1) set in advance; and
a semiconductor element control unit which turns the semiconductor element off to protect the load circuit when the comparing unit determines that the voltage (Vds) is larger than the determining voltage,
wherein a temperature increasing amount of the semiconductor element caused when the semiconductor element (T1) is turned on is ΔTch, an on-resistance value of the semiconductor element (T1) is Ron, and a thermal resistance value of the semiconductor element (T1) is Rth_f;

wherein a temperature increasing amount of a connecting wiring is ΔTw when a current flows into the connecting wiring (WL) for connecting between the load and the semiconductor element, a resistance value per unit length of the connecting wiring is Rw, and a thermal resistance value per unit length of the connecting wiring is Rth_w; and wherein ΔTch is obtained based on an expression of ΔTw/ΔTch=Rth_w/Rth_f*Rw/Ron with respect to the temperature increasing amount ΔTw not exceeding a difference between an upper limit of a permissible temperature of the connecting wiring (WL) and an upper limit of an operational peripheral temperature, then the voltage Vds is obtained based on an expression of ΔTch=Rth_f*Vds$^2$/Ron with respect to the ΔTch, and the obtained voltage Vds is set as the determination voltage.

2. An overcurrent protection apparatus, comprising:
a semiconductor element (T1) which is provided between a load (RL) and a power supply (VB);
a load circuit which controls turning-on and turning-off of the semiconductor element to control driving and stop of the load;
a comparing unit (CMP1) which compares a voltage (Vds) generated across both terminals of the semiconductor element when the semiconductor element is in a turned-on state with a determining voltage (VB−V1) set in advance; and
a semiconductor element control unit which turns the semiconductor element off to protect the load circuit when the comparing unit determines that the voltage (Vds) is larger than the determining voltage, wherein a temperature increasing amount of the semiconductor element caused when the semiconductor element (T1) is turned on is ΔTch, an on-resistance value of the semiconductor element (T1) is Ron, and a thermal resistance value of the semiconductor element (T1) is Rth_f;

wherein a voltage Vds obtained from an expression of ΔTch=Rth_f*Vds$^2$/Ron with respect to the temperature increasing amount ΔTch of the semiconductor element corresponding to a difference between an upper limit of a permissible temperature of the semiconductor element and an upper limit of an operational peripheral temperature is set as a first voltage Vds1;

wherein a temperature increasing amount of a connecting wiring is ΔTw when a current flows into the connecting wiring (WL) for coupling between the load and the semiconductor element, a resistance value per unit length of the connecting wiring is Rw, and a thermal resistance value per unit length of the connecting wiring is Rth_w;

wherein ΔTch is obtained based on an expression of ΔTw/ΔTch=Rth_w/Rth_f*Rw/Ron with respect to the temperature increasing amount ΔTw corresponding to a difference between an upper limit of a permissible temperature of the connecting wiring and an upper limit of an operational peripheral temperature, then the voltage Vds is obtained based on an expression of ΔTch=Rth_f*Vds$^2$/Ron with respect to the ΔTch, and the obtained voltage Vds is set as a second voltage Vds2; and wherein a smaller voltage between the first voltage Vds1 and the second voltage Vds2 is set as a voltage Vlim, and a voltage equal to or smaller than the voltage Vlim and larger than the voltage Vds in a case where a normal current flows is set as the determining voltage.

* * * * *